(12) United States Patent
Miyamoto et al.

(10) Patent No.: US 6,287,067 B1
(45) Date of Patent: Sep. 11, 2001

(54) PROCESSING UNIT AND PROCESSING UNIT STRUCTURE BY ASSEMBLING THEREOF

(75) Inventors: Hidenori Miyamoto, Kanagawa; Susumu Okano, Ehime; Koji Ueda; Taiichiro Aoki, both of Kanagawa, all of (JP)

(73) Assignee: Tokyo Ohka Kogyo Co., Ltd., Kanagawa (JP)

( * ) Notice: Subject to any disclaimer, the term of this patent is extended or adjusted under 35 U.S.C. 154(b) by 0 days.

(21) Appl. No.: 08/947,543

(22) Filed: Oct. 11, 1997

(51) Int. Cl.[7] ...................................................... B65H 1/00
(52) U.S. Cl. ...................... 414/222.13; 414/935; 414/936
(58) Field of Search .................................. 414/937, 935, 414/936, 222.13

(56) References Cited

U.S. PATENT DOCUMENTS

| | | | |
|---|---|---|---|
| 5,239,182 | * | 8/1993 | Tateyama et al. .................... 414/416 |
| 5,403,397 | * | 4/1995 | Beckers et al. ...................... 414/935 |

FOREIGN PATENT DOCUMENTS

| | | |
|---|---|---|
| 59-78535 | 5/1984 | (JP) . |
| 61-123150 | 6/1986 | (JP) . |
| 61-236443 | 10/1986 | (JP) . |
| 62-195143 | 8/1987 | (JP) . |
| 62-222906 | 9/1987 | (JP) . |
| 63-13332 | 1/1988 | (JP) . |
| 63-262853 | 10/1988 | (JP) . |
| 127798 | 1/1989 | (JP) . |
| 4305914 | 10/1992 | (JP) . |

* cited by examiner

Primary Examiner—Thomas J. Brahan
(74) Attorney, Agent, or Firm—Carrier, Blackman & Associates, P.C.; Joseph P. Carrier; William D. Blackman

(57) ABSTRACT

A processing unit structure 1 a plurality of processing units 2, . . . , assembled together continuously in a horizontal direction, wherein a transfer portion 3 is provided on the top of each processing unit 2, . . . , for transferring the plate-like material to be processed between adjacent one of the processing units. A transfer device, such as a shuttle (SH) is provided in each of the transfer portions 3. Each processing unit 2 performs a series of processes on the plate-like material and is constructed with processing blocks 4 and 4 and a transfer portion 3 in the form of a transfer robot (R) positioned between the processing blocks 4 and 4. Further, each processing unit 2. . . is independent from one another so that it is possible to selectively add and remove different ones of the processing units with respect to the processing unit structure 1.

24 Claims, 9 Drawing Sheets

PROCESSING UNIT AND PROCESSING UNIT STRUCTURE BY ASSEMBLING THEREOF

BACKGROUND OF THE INVENTION

1. Field of the Invention

The present invention relates to a processing unit comprising a series of processing apparatuses for performing a series of processes or treatments on a semiconductor wafer or a glass substrate, and to a processing unit structure constructed by assembling the processing apparatuses mentioned above 2. Description of Related Art A number of processes are necessitated for forming integrated circuits on a semiconductor wafer or for forming elements such as TFTS, etc., on a glass substrate.

For instance, a process for forming an exciter resist filn layer on a surface of a substrate is one example. Here, the substrate must be treated through the following or other processes, dehydration baking, BARC (bottom anti-reflection coating), baking, a pre-process of resist application, resist application, pre-baking, exposure, post-exposure baking (PEB), developing, and post-baking.

For performing such processes as mentioned above continuously, according the conventional art, apparatuses or devices for each process are separately aligned in a horizontal direction, in an assembly line-like fashion and in sequential order thereof. However, the process line configuration is not always of a straight assembly line-like shape, but it sometimes also takes an "L" shape ot a rectangular shape depending on, or fitting for, the configuration of the manufacturing works or facilities.

As mentioned above, the conventional apparatuses or facilities for processing semiconductor waters or glass substrates extend continuously in the horizontal direction, and therefore the area occupied there by becomes relatively large.

Further sometimes, some of the processing apparatuses or facilities must be removed or new ones additionally be connected to those which are previously provided because a processor part of the process should be omitted or a new process be newly added thereto. However, with the processing process of the conventional art, it is very difficult to add and remove the processing apparatus or facelities.

SUMMARY OF THE INVENTION

According to the present invention, for resolving the limitations and mentioned above, there is provided a processing unit for performing a series of processes on a plate-like material, such as a semiconductor water or a glass substrate, comprising: a pair of processing blocks each of which is constituted by a plurality of processing apparatuses built up in the vertical direction with plural stages: and a transfer robot, wherein said transfer robot further comprises: an elevating body which is able to stop at a position of said each stage of sdid processing apparatusses of said processing blocks; and an arm which is provided on said elevating body so as to take in and out the plate-like material to be processed with respect to each said stage of said processing apparatusses of said processing blocks.

Further, according to the present invention, there is also provided a processing unit for performing a series of processes on a plate-like material, such as a semiconductor wafer or a glass substrate, comprising; a pair of processing blocks which are constituted by building up a plurality of processing apparatuses in the vertical direction with plural stages; and a transfer robot, wherein said transfer robot comprises: an elevating body which is able to stop at a position of each said stage of said processing apparatusses of said processing blocks; an arm which is provided on said elevating body so as to take in and out the plate-like material to be processed with respect to each said stage of said processing apparatusses of said processing blocks, and a turning mechanism for turning said arm within a horizontal plane.

Further, according to the present invention, there is also provided a processing unit structure including a plurality of said processing units assembled in series, wherein each of said processing units is constructed such that it is able to be selectively added and removed with respect to said processing unit structure independently of the other said processing units, and the assembled processing units are positioned closely adjacent to each other for easy transfer of said plate-like material between adjacent processing units.

Further, according to the present intention, at a top portion of each said processing unit there is installed a transfer apparatus for transferring said plate-like material to be processed between said adjacent processing units. With such a construction, the plurality of processing apparatuses can be easily provided in series.

Further, according to the present invention, one of the processing unita is an indexing unit positioned on a side portion of said processing unit structuxe. The indexing unit is constructed with an indexing block and an exchanger robot, as the transfer robot wherein said indexing block holds cassettes in which said plate-like material to be processed received, the cassetes being positioned separately in stages in the vertical direction, and said exchanger robot comprises an elevating body which is able to stop at a receiving position of each said stage of said cassettes of said indexing block, and an arm which is provided on said elevating body so as to take in and out the plate-like material to be processed with respect to said cassettes of said indexing block.

DESCRIPTION OF THE PREFERRED EMBODIMENTS

Figure 1:
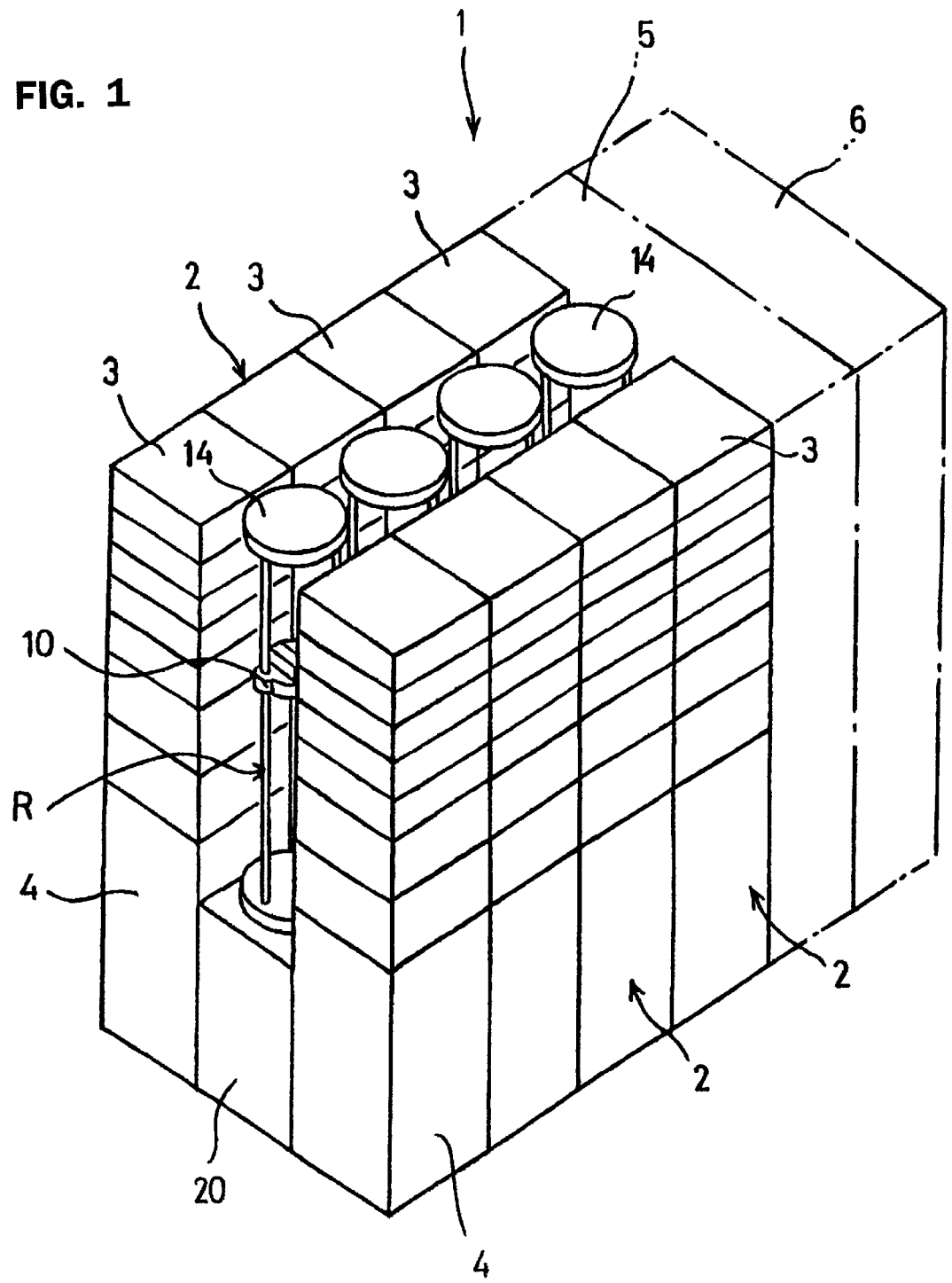
FIG. 1 shows a perspective view of the entire processing unit structure in accordance with the present invention.
Figure 2:
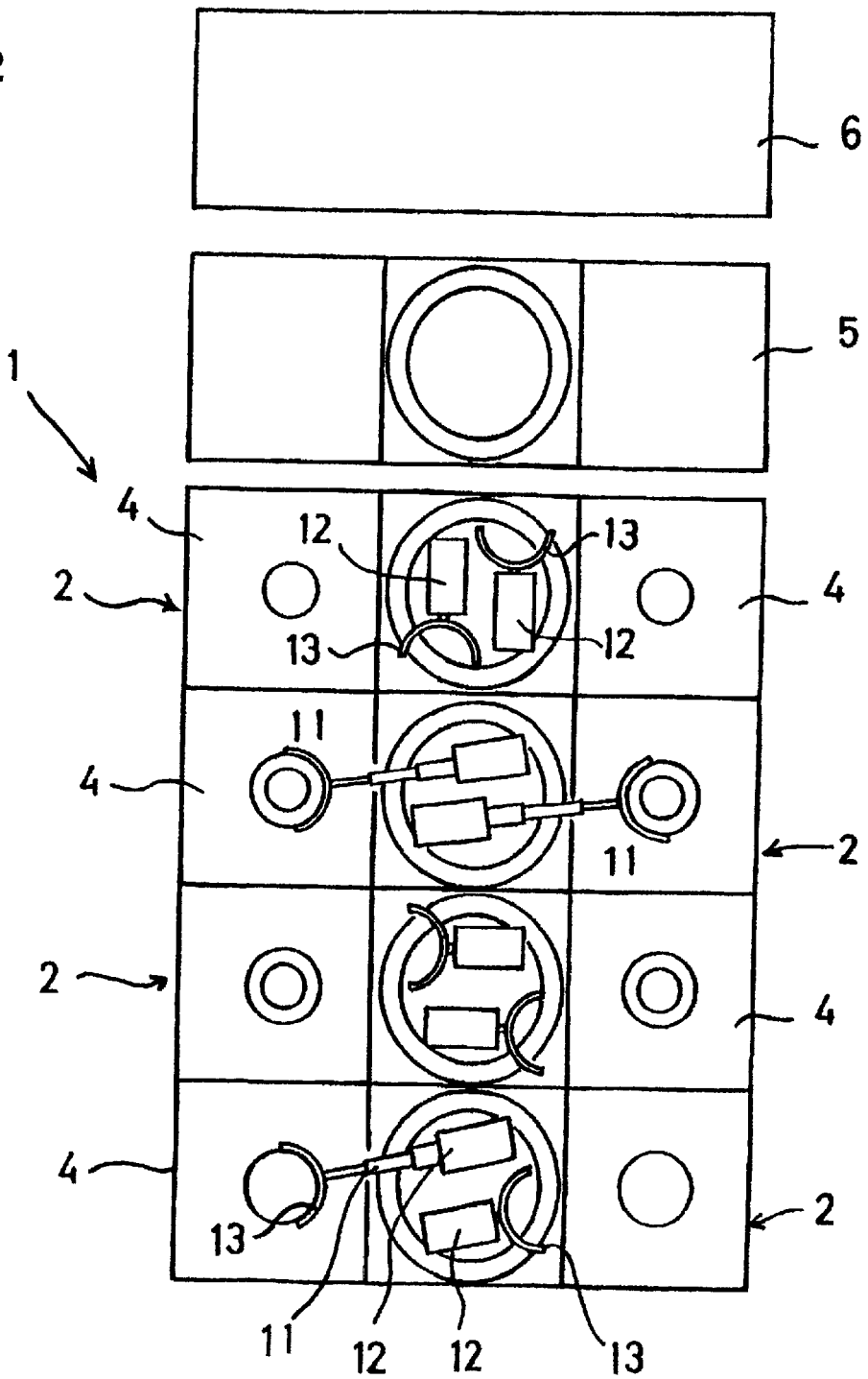
FIG. 2 shows a top plane view of the same processing unit structure.
Figure 3:
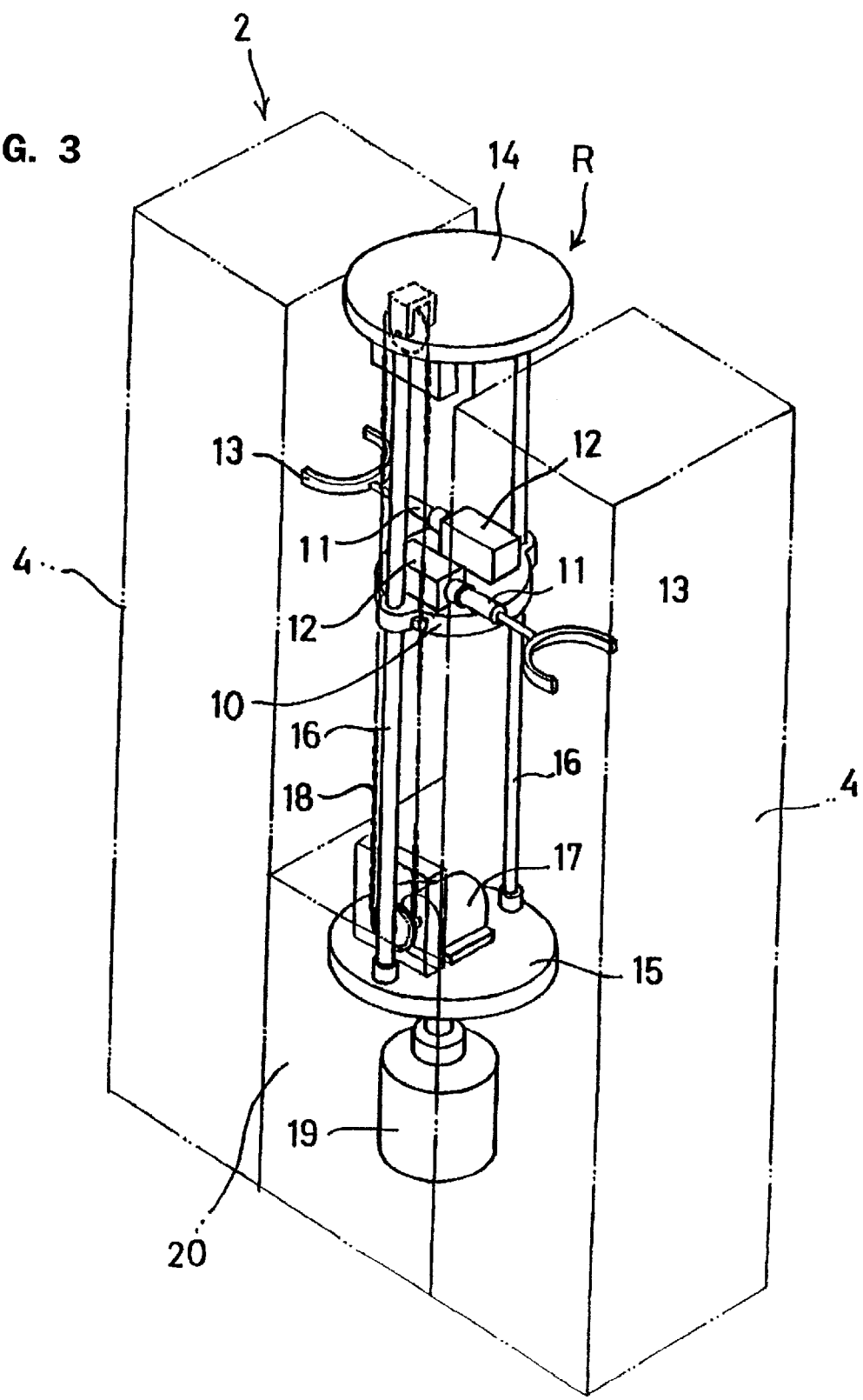
FIG. 3 shows a perspective view of a transfer robot of a processing apparatus constituting a part of the aforementioned processing unit structure.

Hereinafter, detailed explanation of the preferred embodiments according to the present invention and comparisons will be given by referring to the attached drawings.

The processing unit structure 1 is constructed by assembling a plurality of processing units 2, 2 . . . , in which each of the processing units 2, 2 . . . is independent of each other. Therefore, it is possible to easily increase or decrease the number of processing apparatuses 2, 2 . . . with respect to the processing unit structure 1 for correspondingly performing different series of processes.

Further, for making it possible to transfer a plate-like material to be proces:sed, such as the semiconductor waters and the glass substrates, between adjacent processing units 2, 2 . . . , a transfer portion 3 is provided at the top of each of the processing units 2, 2 . . . , and thereby, the plate-like materials can be transferred between the respective adjacent processing units 2, 2 . . . by a shuttle (SH) and so on which is provided in the transfer portion 3. However, inside of each of the transfer portions 3, there is also provided a mechanism for performing alignment of the plate-like materials to be processed.

Each processing unit 2 is constructed with processing blocks 4 and 4 and a transfer robot (R) which is positioned between the processing blocks 4 and 4. The processing blocks are constructed by building up in vertically aligned arrangements, a number of processing apparatuses, for example, a rotary cup type coating device (RC), an open-cup type coating device (sc), a vacuum drier (VD), a cool plate (CP), a hot plate (HP), a back-surface rinsing device (BR), an adhesion device (AD), an ultra violet light radiator (UV), an air processor (AP), a developer (DEV), a post-exposure baking device (PB) and so on, forming several stages.

Each of the processing units has the same size in horizontal and vertical directions thereof, therefore if one is placed onto another processing unit, it constitutes a cubic body therewith. However, each processing unit may have a different width (in this case, the size in the vertical direction).

Further, on one side of the processing unit structure 1, there are positioned an interface unit S and an exposure unit 6 into which the plate-like materials to be processed are sent through the interface unit 5.

Further, the transfer robot; (R) has an elevating body 10 which can stop at the position of each stage of the processing blocks 4, and further has artns 11 and 11 which are provided on the elevating body 10 for taking the plate-like materials to be processed in and out to and from the processing apparatus of each stage. The arms 11 and 11 are expanded and contracted by respective cylinder units 12 and 12 in opposite directions to each other, and at each top edge thereof there is provided a hand 13 for holding around the plate-like material to be processed.

The elevating body 10 is engaged by guide rods 16 and 16 which are provided between a ceiling plate 14 and a bottom plate 15, and is moved up and down by the actuation of a motor 17 which is provided on the bottom plate 15, through a chain 18.

Further, the bottom plate 15 is constructed in such a manner that it can be rotated by another motor 19 provided separately, within an angle of 180° on a plane, and thereby the arms 11 and 11 can exchange their positions by the rotation thereof. Collectively, the plates 14, 15 and the guide rods 16 form a main support portion of the robot R, which portion moves neither vertically or linearly in the processing unit 2.

Figure 4:
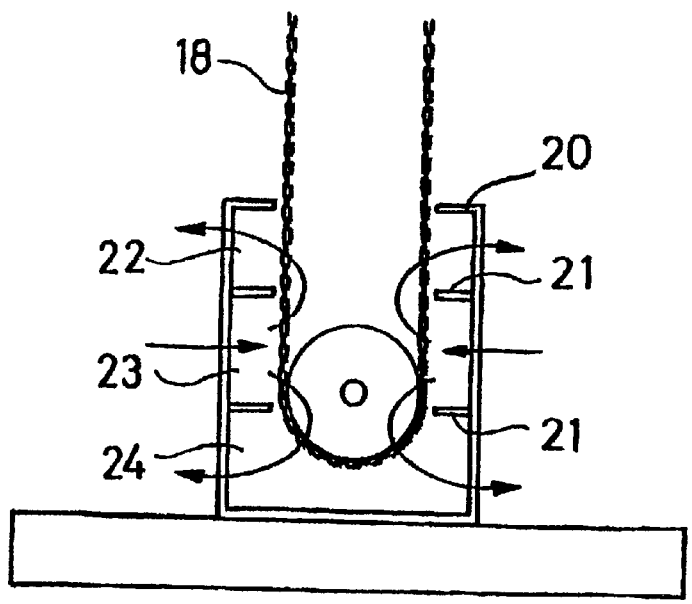
FIG. 4 shows a cross-sectional view of a lower portion of the transfer robot.

By the way, the lower portion of the transfer robot (R), as is shown in FIG. 4, is received within a box 20, the inside of which is divided by partitions 21, 21 . . . into an upper space 22, a middle space 23 and a lower space 24. By introducing air from the middle space 23, small dust or dirt adhered onto the chain 18 can be collected in the upper space 22 or the lower space 24, as indicated by the arrows, thereby preventing the dust or dirt from being brought into the portions where the plurality of processing apparatus are built up.

Next, a structural example of the processing unit structure 1 will be explained by referring to FIGS. 5 through 9.

Figure 5:
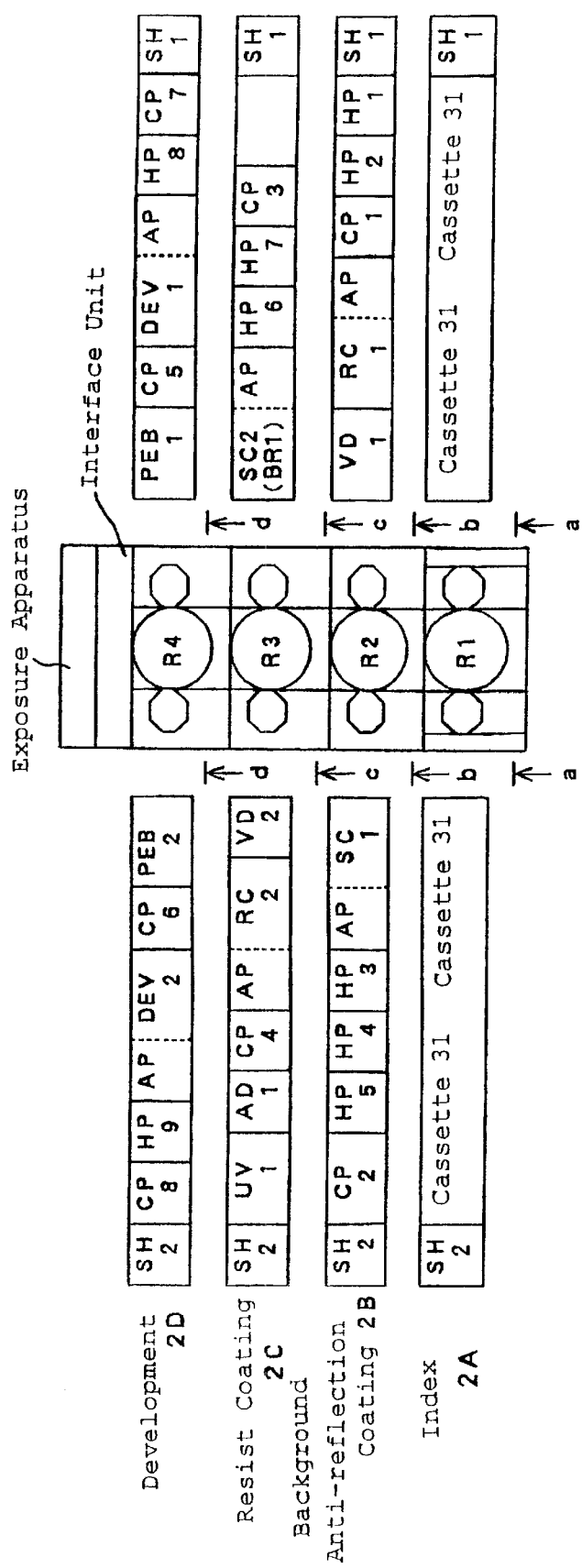
FIG. 5 shows an exploded plane view of the processing unit structure while conducting steps of processes, including the forming of the bottom anti-reflection film layer, the coating of resist film, and development.
Figure 6:
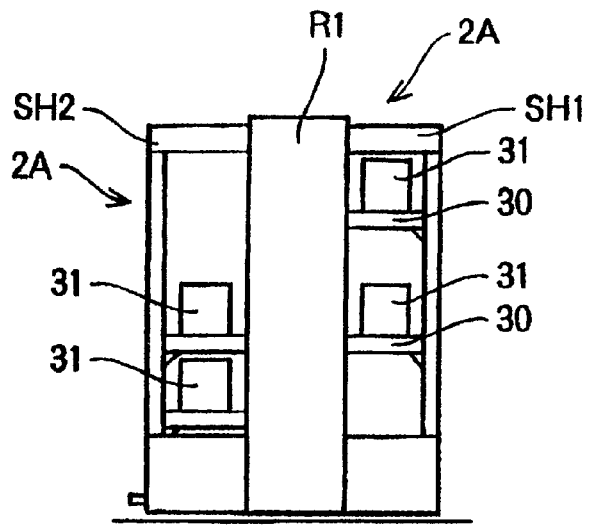
FIG. 6 a top plane view of the processing unit seen from cutting line a—a in FIG. 5.
Figure 7:
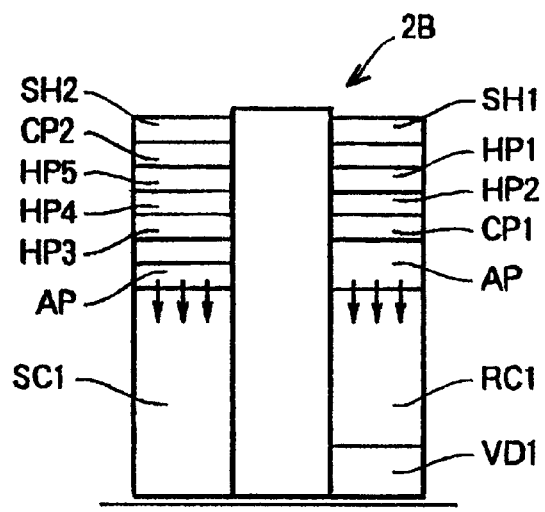
FIG. 7 a top plane view of the processing unit seen from cutting line b—b in FIG. 5.
Figure 8:
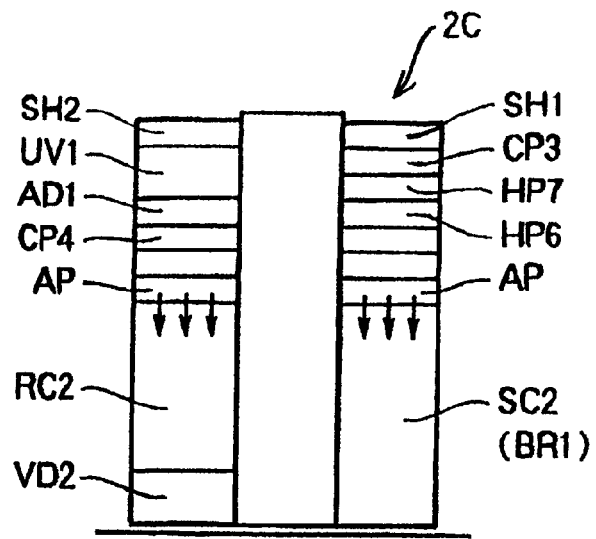
FIG. 8 a top plane view of the processing unit seen from cutting line c—c in FIG. 5.
Figure 9:
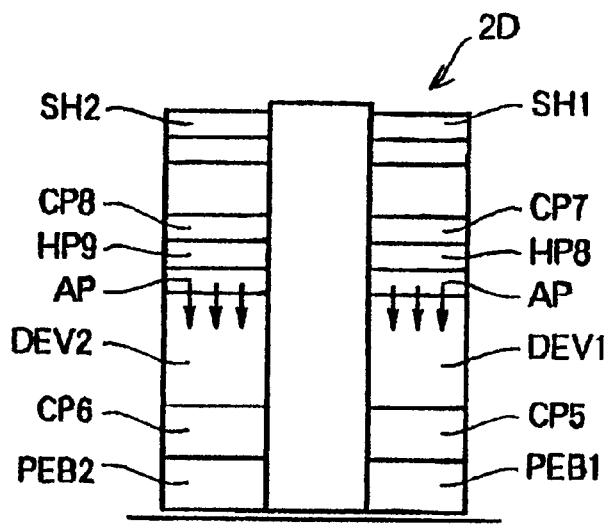
FIG. 9 a top plane view of the processing unit seen from cutting line d—d in FIG. 5.

The processing unit structure shown in FIG. 5 is constructed with a processing unit 2A for indexing, a processing unit 2B for coating an anti-reflection film layer on a surface of the plate-like materials to be processed as a background layer, a processing unit 2C for coating the resist layer on the anti-reflection film layer, and a processing unit 2D for developing the resist film layer after exposure thereof.

In the processing unit 2A for indexing, cassette bases 30, 30 . . . are provided on both sides of the transfer robot (R1), in such manner that they can go up or down, in place of the processing block. The cassette bases 30, 30 . . . can move up and down independently from the other cassette bases, and are so constructed that each cassette 31 can be shifted in the direction thereof by 90°.

Then, explaining an operation of the processing unit 2A for indexing, first of all, the cassette base 30 is fitted or fixed to a transfer level of an automatic conveyer provided at a work site or facility, and the cassette 31 is received on the cassette base 30 from the automatic conveyer. The cassette 31 is turned into a direction in which it can be accessed by the robot (R1) and then from the cassette 31 is taken the plate-like material to be processed by the robot (R1). Thereafter, the plate-like material to be processed is transferred to the transfer portion 3 from the robot (R1) and is sent to the transfer portion of the adjacent processing unit 2B by the transfer devices, such as the shuttle (SH), which is provided within the transfer portion 3.

The plate-like material to be processed which is brought into the transfer portion of the processing unit 2B is further sent to the hot plate (HP1) and (HP2) for dehydration processing baking thereof, so as to remove water contained in the material, and thereafter, it is cooled or adjusted in temperature thereof by the cool plate (CP1). Then, the plate-like material is coated with coating liquid for the anti-reflection film layer by using the rotary type coating device (RC1), and is dried to come degree in the vacuum drier (VD1). The plate-like material is further processed by edge rinsing in the open-cup type cleaning device (SC1), and thereafter, is baked while it passes through the hot plates (HP3), (HP4) and (HP5) and is further cooled so as to be adjusted in temperature thereof by the cool plate (CP2).

After this, the plate-like material on which the anti-reflection film is coated is brought into the processing unit 2C by the transfer robot (R2) and the shuttle (SH2) for further processing.

The material to be processed in the processing unit 2C is sent sequentially by the transfer robot (R3) to the ultra violet light radiator (UV1), the adhesion device (AD1) and the cool plate (CP4) so that the pre-processing for the resist film forming can be carried out.

Next, the plate-like material is coated with the resist coating liquid by the rotary coating device (RC2) and is dried to some degree in the vacuum drier (VD2). It is further processed by a back-side rinsing (BR1) in the open-cup type cleaning device (SC2), and thereafter, it is baked in the hot plates (HP6) and (HP7) and is further cooled and adjusted in temperature thereof by the cool plate (CP3).

Thereafter, the material to be treated is sent into the processing unit 2D by the transfer robot (R3) and the shuttle (SH1).

The material to be processed which is brought into the processing unit 2D is at once transferred to the interface unit of an exposure apparatus by the transfer robot (R4), and is brought into the exposure apparatus 6 through the interface 5 to be exposed therein, The exposed plate-like material to be processed is turned back to the processing unit 2D again; and is sent to the post-exposure baking device (PB1) or (PB2) by the transfer robot (R4) of this processing unit 2D to be processed by the post-exposure baking. After that, it is cooled and adjusted in temperature thereof by the cool plates (CP5) and (CP6), and it is further developed in the developing devices (DEV1, DEV2). After it is treated by the post-baking process in the hot plates (HP8) and (HP9), it is further cooled and adjusted in temperature thereof by the cool plates (CP7) and (CP8), and is turned back to the processing unit 2A for indexing through the shuttle (SH2) which is provided on one side of each processing unit 2A through 2D, so as to be received in a predetermined one of the cassettes 31 within the processing unit 2A.

Figure 10:
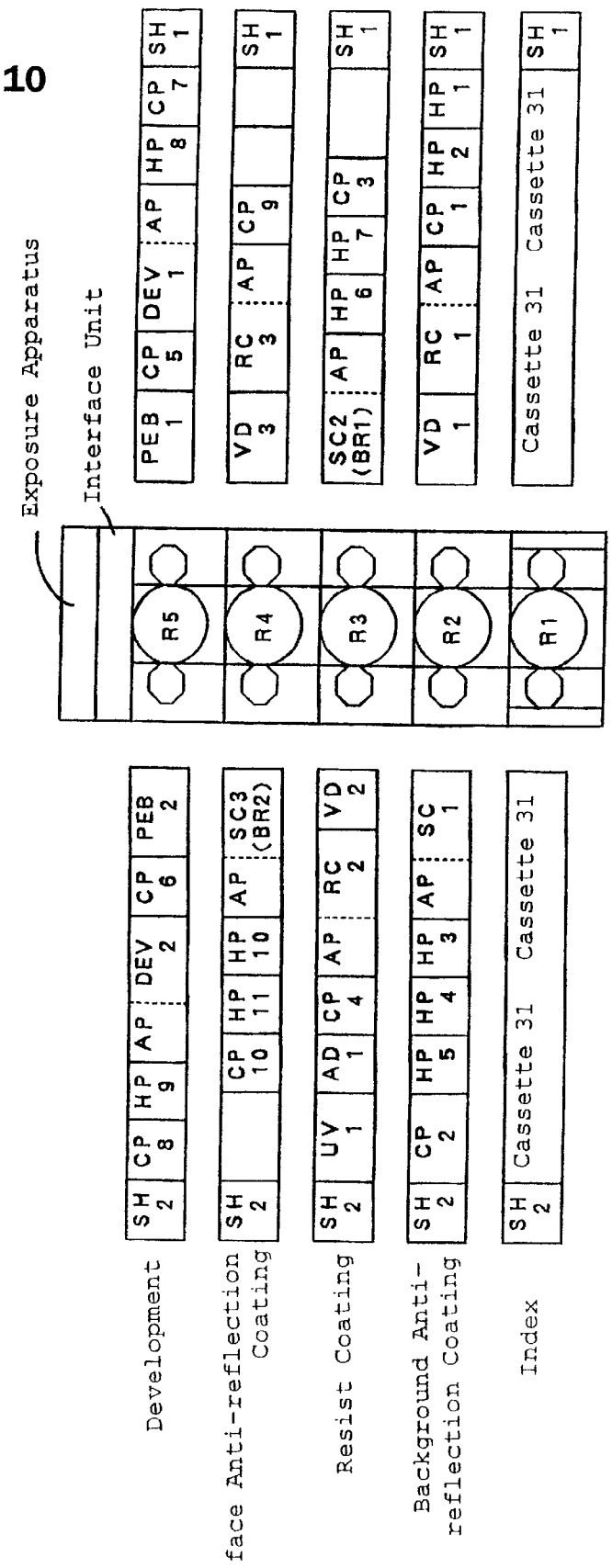
FIG. 10 shows an exploded plane view of the processing unit structure, which performs the process steps of the forming of the bottom anti-reflection film layer, the coating of the resist layer, the forming of the surface anti-reflection rilm layer, and development.

FIG. 10 shows an exploded plane view of the processing unit structure, which carries out the processing steps of the background anti-xeflection film layer forming, the resist coating, the surface anti-reflection film layer forming, and the development. In this processing unit structure, a processing unit 2E is positioned between the processing unit 2C for coating the resist layer and the processing unit 2D for developing the resist layer after the exposure thereof.

The operations of the processing units 2A through 2D are the same As those of the embodiment mentioned above, and therefore they are omitted, and only the operation of the processing unit 2E will be given hereinafter.

Namely, the plate-like Material to be processed which is transferred to a transfer robot (R4) via a shuttle (SH1) of the processing unit 2E is coated with the anti-reflection coating liquid by a rotary coating device (RC3) and is dried to some degree through the vacuum drier (VD3), after being cooled or adjusted in temperature thereof through the cool plate (CP9). Then, it is treated with a back-side rinsing (BR2) through the open-cup type cleaning device (SC3), and after that it is baked through the hot plates (HP10) and (HP11) and further is cooled and adjusted in temperature thereof through the cool plate (CP10).

Thereafter, the material to be processed, on a surface of a resist layer of which is formed the anti-reflection film layer, is sent to the interface 5 and the exposure apparatus 6 through the transfer robot (R5) of the processing unit 2D, and the material to be processed which is completed with the exposure process is turned back to the processing unit 2D again to be developed.

Figure 11:
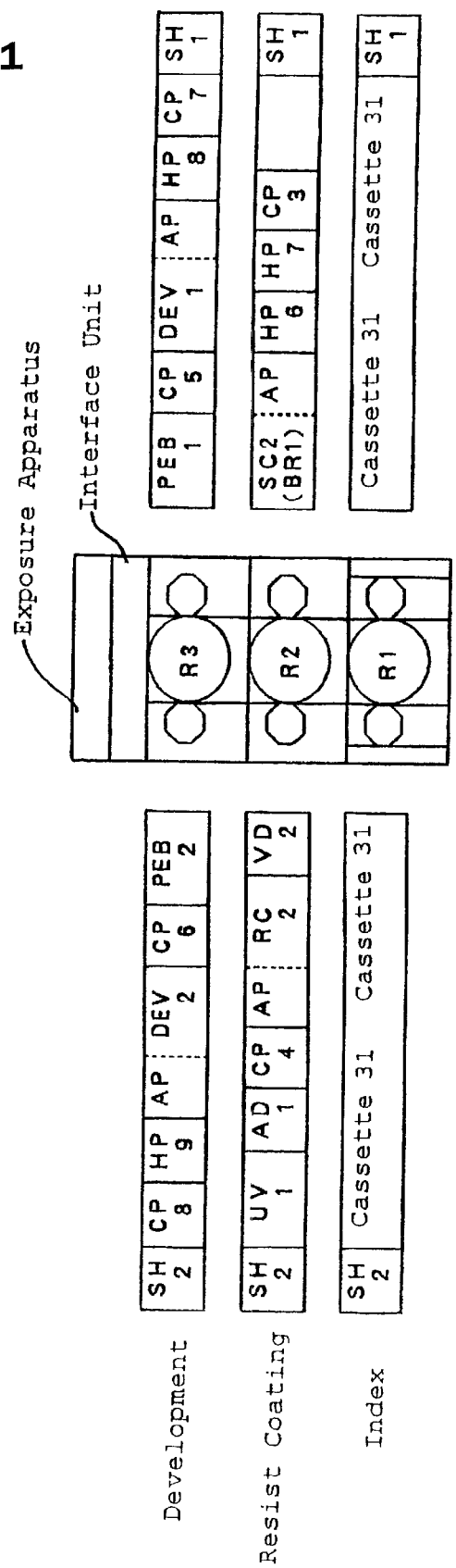
FIG. 11 shows an exploded plane view of the processing unit structure, while conducting the processing steps for the resist layer coating and developing.

FIG. 11 shows an exploded plane view of the processing unit structure, which carries out the processing steps of the resist layer coating and the developing. In this processing unit structure there are performed standard processes for the resist layer coating and the developing. Therefore, the processing unit 2B for forming the background anti-reflection film layer and the processing unit 2E for forming the surface anti-reflection film layer are removed from the processing unit structure which was mentioned above In relation to FIG 10.

As fully explained in the above, according to the present invention, as a processing unit for treating or processing the plate-like material, such as semiconductor wafers or glass substrates, with a series of processes, or alternatively, as a processing unit structure constructed by assembling multiple processing anits continuously in series, each processing unit is basically constructed by building up in vertically aligned arrangements, a number of processing apparatused into processing blocks, each processing apparatus performing a respective single process in the vertical direction, and a transfer robot disposed between the processing blocks such that it can individually accedd each of the processing apparatus. Therefore, it is possible to utilize manufacturing space effectively.

Further, by restricting the overall configuration of the processing unit which is structured by building up a plurality of processing blocks to a predetermined size from a plurality of vertically processing apparatuses it is easily possible to conveniebtly asemble more than one processing unit together in various structures by increasing of decreasing. the number of processing units, or by exchanging various ones of the processing units for each other and thereby easily construct different processing unit structures for performing various treatments easily. Although there are disclosed above the presently preferred embodiments of the invention, it will be understood by persons skilled in the art that various changes and modifications can be made thereto without departing from the spirit or essence of the invention. The scope of the invention is, therefore, indicated by the appended claims rather than by the foregoing description.

What is claimed is:

1. A processing unit for completely performing a series of processes on a plate-like material, comprising:

a plurality of processing blocks each of which is constituted by a plurality of processing apparatuses arranged one atop another so as to be aligned with each other in a vertical direction;

a transfer robot disposed centrally between and facing each of said processing blocks, wherein the transfer robot comprises:

an elevating body which is adapted to stop at a position of each said processing apparatus of each said processing block; and an arm which is provided on said elevating body for moving the plate-like material to be processed in and out with respect to each said processing apparatus of said processing blocks; and a transfer apparatus for transferring said plate-like material to be processed from the processing unit to an adjacent processing unit.

2. A processing unit according to claim 1, wherein said processing unit includes a pair of said blocks and said transfer robot further comprises:

a turning mechanism for turning said arm within a horizontal plane.

3. A processing unit structure as defined in claim 1, wherein respective ones of said transfer apparatus are disposed at top portions of corresponding ones of said processing units.

4. A processing unit as defined in claim 1, wherein each said processing block includes different types of processing apparatuses, and said transfer robot transfers the plate-like material sequentially between the processing apparatuses of said processing blocks so that multiple different processes are performed on the plate-like material by the processing apparatuses of each said block.

5. A processing unit as defined in claim 1, wherein said transfer robot includes a main support portion which moves neither vertically or linearly in the processing unit.

6. A processing unit as defined in claim 1, wherein said transfer apparatus is separate from said transfer robot.

7. A processing unit structure for performing a series of processes on a plate-like material, comprising a plurality of processing units assembled in series, wherein each of said processing units comprises:

a plurality of processing blocks each of which is constituted by a plurality of processing apparatuses arranged one atop another so as to be aligned with each other in a vertical direction;

a transfer robot disposed centrally between and facing each of said processing blocks, the transfer robot comprising an elevating body which is adapted to stop at a position of each said processing apparatus of each of said processing blocks, and an arm which is provided on said elevating body for moving the plate-like material to be processed in and out with respect to each said processing apparatus of said processing blocks; and a transfer apparatus for transferring said plate-like material to be processed from the processing unit to an adjacent one of said processing units; wherein each of said processing units is self-contained and independent of the other said processing units such that each said processing unit can be selectively added and removed with respect to said processing unit structure independently of the other said processing units, and the assembled processing units are positioned closely adjacent to each other for easy transfer of said plate-like material between adjacent ones of said processing units.

8. A processing unit structure as defined in claim 7, further comprising an indexing unit positioned on a side portion of said processing unit structure, said indexing unit including an indexing block and one said transfer robot, wherein:

said indexing block holds cassettes in which said plate-like material to be processed is received, said cassettes being positioned separately in a vertical direction, and said arm of said transfer robot of the indexing unit is adapted to move the plate-like material to be processed in and out with respect to said cassettes of said indexing block.

9. A processing unit structure as defined in claim 7, wherein each of said transfer robots further comprises a turning mechanism for turning said arm of the transfer robot within a horizontal plane.

10. A processing unit structure as defined in claim 7, wherein each of said processing units has the same sizes in horizontal and vertical directions thereof.

11. A processing unit structure as defined in claim 7, wherein each said processing block includes different types of processing apparatuses, and said transfer robot transfers the plate-like material sequentially between the processing apparatuses of said processing blocks so that multiple different processes are performed on the plate-like material by the processing apparatuses of each said block.

12. A processing unit structure as defined in claim 7, wherein said transfer apparatus is separate from said transfer robot.

13. A processing unit for completely performing a series of processes on a plate-like material, comprising:

a plurality of processing apparatuses arranged continuously together in vertically extending processing blocks;

means for transferring said plate-like material between said processing apparatuses;

said transferring means comprises an elevating body disposed centrally between and facing each of said processing blocks and adapted to be selectively disposed at a position of each said processing apparatus of each said processing block, and an arm provided on said elevating body for moving the plate-like material in and out with respect to each said processing apparatus; and a transfer apparatus for transferring said plate-like material to be processed from the processing unit to an adjacent processing unit.

14. A processing unit according to claim 13, wherein said transferring means further comprises a turning mechanism for turning said arm within a horizontal plane.

15. A processing unit according to claim 13, wherein said processing unit includes a pair of said blocks and said transferring means is disposed between the pair of blocks.

16. A processing unit as defined in claim 13, wherein each said processing block includes different types of processing apparatuses, and said transfer means transfers the plate-like material sequentially between the processing apparatuses of said processing blocks so that multiple different processes are performed on the plate-like material by the processing apparatuses of each said block.

17. A processing unit as defined in claim 13, wherein said transfer robot includes a main support portion which moves neither vertically or linearly in the processing unit.

18. A procesing unit as defined in claim 13, wherein said transfer apparatus is separate from said transfer means.

19. A processing unit structure for performing a series of processes on a plate-like material, comprising a plurality of processing units assembled together in series, wherein each said processing unit comprises:

a plurality of processing blocks each of which is constituted by a plurality of processing apparatuses arranged one atop another so as to be aligned with each other in a vertical direction;

means for transferring said plate-like material between said processing apparatuses;

said transferring means comprises an elevating body disposed centrally between and facing each of said processing blocks and which is adapted to stop at a position of each said processing apparatus of each of said processing blocks, and an arm which is provided on said elevating body for moving the plate-like material to be processed in and out with respect to each said processing apparatus of said processing blocks; and a transfer apparatus for transferring said plate-like material to be processed from the processing unit to an adjacent one of said processing units; wherein each of said processing units is self-contained and independently of the other said processing units such that each said processing unit can be selectively added and removed with respect to said processing unit structure independently of the other said processing units, and the processing units in said structure are positioned closely adjacent to each other for easy transfer of said plate-like material between adjacent ones of said processing units.

20. A processing unit structure according to claim 12, wherein said processing units all have the same sizes in horizontal and vertical directions thereof.

21. A processing unit structure as defined in claim 19, further comprising an indexing unit positioned on a side portion of said processing unit structure, said indexing unit including an indexing block and one said transferring means, wherein:

said indexing block holds cassettes in which said plate-like material to be processed is received, said cassettes being positioned separately in a vertical direction, and said arm of said transferring means of the indexing unit is adapted to move the plate-like material to be processed in and out with respect to said cassettes of said indexing block.

22. A processing unit structure as defined in claim 19, wherein respective ones of said transfer apparatus are disposed at top portions of corresponding ones of said processing units.

23. A processing unit structure as defmed in claim 19, wherein each said processing block includes different types of processing apparatuses, and said transfer means transfers the plate-like material sequentially between the processing apparatuses of said processing blocks so that multiple different processes are performed on the plate-like material by the processing apparatuses of each said block.

24. A processing unit structure as define in claim 19, wherein said transfer apparatus is separate from said transfer means.

* * * * *

UNITED STATES PATENT AND TRADEMARK OFFICE
CERTIFICATE OF CORRECTION

PATENT NO. : 6,287,067 B1
DATED : September 11, 2001
INVENTOR(S) : Miyamoto et al.

It is certified that error appears in the above-identified patent and that said Letters Patent is hereby corrected as shown below:

Title page, Item [54], and Column 1, lines 2-3,
Title, change "BY ASSEMBLING THEREOF" to -- INCLUDING PLURAL PROCESSING UNITS ASSEMBLED TOGETHER --;
Under Item "[56] References Cited", further under "U.S. PATENT DOCUMENTS", insert the following additional references:
-- 5,202,716  *  4/1993    Tateyama et al. ...........414/217
   5,430,271  *  7/1995    Orgami et al. ..............414/935
   5,639,301  *  6/1997    Sasada et al. ...............414/937
   5,664,254  *  9/1997    Ohkura et al. ..............414/937
   5,711,646  *  1/1998    Ueda et al. .................414/937
   5,733,024  *  3/1998    Slocum et al . .............414/935 --;
Item "[57] ABSTRACT",
Line 1, before "a plurality" insert -- for processing a plate-like material such as semiconductor wafer or a glass substrate includes --;
Line 5, change "one" to -- ones --;
Line 15, before the period, insert -- so that the structure can easily be modified to perform various treatments on the same or different plate-like materials --.

Column 1,
Line 17, change "TFTS"to -- TFTs --;
Line 18, change "exciter" to -- excimer --; change "filn" to -- film --;
Line 21, change "processes," to -- processes: --;
Lines 26 and 27, after "according" insert -- to --; change "art, " to -- art practices, --;
Lines 31 and 32, change "ot" to -- or --;
Lines 35 and 36, change "waters" to -- wafers --;
Lines 37 and 38, change "there by" to -- thereby --;
Lines 39 and 40, after "Further" insert a comma;
Lines 42 and 43, change "processor" to -- process or --; after "omitted" insert a comma;
Lines 45 and 46, change "apparatus or facelities" to -- apparatuses or facilities --;
Line 50, before "mentioned" insert -- problems --;
Line 52, change "water" to -- wafer --;
Line 55, change the colon to a semicolon;
Line 56, delete "further";
Line 57, before "said" insert -- each --;
Line 58, change "sdid" to -- said --; change "apparatusses" to -- apparatuses --;
Line 61, change "apparatusses" to -- apparatuses --;
Line 66, change the semicolon to a colon.

UNITED STATES PATENT AND TRADEMARK OFFICE
CERTIFICATE OF CORRECTION

PATENT NO. : 6,287,067 B1
DATED : September 11, 2001
INVENTOR(S) : Miyamoto et al.

It is certified that error appears in the above-identified patent and that said Letters Patent is hereby corrected as shown below:

Column 2,
Line 4, change "apparatusses" to -- apparatuses --;
Line 8, change "apparatusses" to -- apparatuses --; change the comma to a semicolon;
Line 12, after "structure" insert a comma;
Lines 20 and 21, change "intention" to -- invention --;
Lines 27 and 28, change "unita" to -- units --;
Lines 28 and 29, change "structuxe" to -- structure --;
Lines 30 and 31, change "robot, as the transfer robot" to -- robot as the transfer robot, --;
Lines 32 and 33, after "processed" insert -- is --; change "cassetes" to -- cassettes -- .

Column 3,
Line 2, change "rilm" to -- film --;
Line 17, change "apparatuses" to -- units --;
Line 21, change "proces:sed" to -- processed --; change "waters" to -- wafers --;
Line 37, change "device (sc)" to -- device (SC) --;
Lines 49 and 50, change "unit S" to -- unit 5 --;
Line 53, after "robot" delete the semicolon;
Line 55, change "artns" to -- arms --.

Column 4,
Line 7, change "or" to -- nor --;
Line 17, change "apparatus" to -- apparatuses --;
Lines 40 and 41, between "(R1)" and "and" insert a comma;
Lines 45 and 46, change "devices" to -- device --,
Line 56, change "come" to -- some --.

Column 5,
Line 21, change "(PB1) or (PB2)" to -- (PEB1) or (PEB2) --;
Lines 36 and 37, change "anti-xeflection" to -- anti-reflection --;
Lines 43 and 44, change "As" to -- as --;
Lines 46 and 47, change "Material" to -- material --.

Column 6,
Line 6, change "In" to -- in --;
Line 13, change "anits" to -- units --;
Line 15, change "apparatused" to -- apparatuses --;
Line 19, change "accedd" to -- access --;
Line 25, after "vertically" insert -- aligned --; after "apparatuses" insert a comma;
Line 26, change "conveniebtly asemble" to -- conveniently assemble --;
Line 27, change "increasing of decreasing" to -- increasing or decreasing --; after "decreasing" delete the period;

UNITED STATES PATENT AND TRADEMARK OFFICE
CERTIFICATE OF CORRECTION

PATENT NO.    : 6,287,067 B1
DATED         : September 11, 2001
INVENTOR(S)   : Miyamoto et al.

It is certified that error appears in the above-identified patent and that said Letters Patent is hereby corrected as shown below:

<u>Column 6 (continued),</u>
Line 29, after "each other" insert a comma;
Line 31, begin a new paragraph with "Although".

<u>Column 8,</u>
Line 60, change "pently" to -- pendent -- .

<u>Column 9,</u>
Line 1, change "claim 12" to -- claim 19 -- .

<u>Column 10,</u>
Line 5, change "defmed" to -- defined --;
Line 12, change "define" to -- defined --.

Signed and Sealed this

Eleventh Day of June, 2002

*Attest:*

*Attesting Officer*

JAMES E. ROGAN
*Director of the United States Patent and Trademark Office*